(12) United States Patent
Xu

(10) Patent No.: US 10,115,723 B2
(45) Date of Patent: Oct. 30, 2018

(54) COMPLEMENTARY METAL OXIDE SEMICONDUCTOR (CMOS) DEVICES EMPLOYING PLASMA-DOPED SOURCE/DRAIN STRUCTURES AND RELATED METHODS

(71) Applicant: QUALCOMM Incorporated, San Diego, CA (US)

(72) Inventor: Jeffrey Junhao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/602,326

(22) Filed: May 23, 2017

(65) Prior Publication Data

US 2017/0352662 A1 Dec. 7, 2017

Related U.S. Application Data

(60) Provisional application No. 62/345,335, filed on Jun. 3, 2016.

(51) Int. Cl.
| | |
|---|---|
| *H01L 27/092* | (2006.01) |
| *H01L 29/417* | (2006.01) |
| *H01L 29/78* | (2006.01) |
| *H01L 21/8234* | (2006.01) |

(Continued)

(52) U.S. Cl.
CPC .. *H01L 27/0924* (2013.01); *H01L 21/823431* (2013.01); *H01L 21/823437* (2013.01); *H01L 21/823468* (2013.01); *H01L 21/823475* (2013.01); *H01L 29/41791* (2013.01); *H01L 29/66545* (2013.01); *H01L 29/7845* (2013.01); *H01L 29/7851* (2013.01); *H01L 21/823807* (2013.01); *H01L 21/823821* (2013.01);

(Continued)

(58) Field of Classification Search
CPC ..... H01L 21/823431; H01L 21/823437; H01L 21/823468; H01L 21/823475; H01L 27/0924

See application file for complete search history.

(56) References Cited

U.S. PATENT DOCUMENTS

| | | | |
|---|---|---|---|
| 5,763,319 A | * | 6/1998 | Ling ........................ C23C 14/48 438/514 |
| 7,994,016 B2 | | 8/2011 | Tsai et al. |
| 8,574,995 B2 | | 11/2013 | Jeng |

(Continued)

*Primary Examiner* — Yosef Gebreyesus
(74) *Attorney, Agent, or Firm* — W&T/Qualcomm

(57) ABSTRACT

Complementary metal oxide semiconductor (CMOS) devices employing plasma-doped source/drain structures and related methods are disclosed. In certain aspects, a source and drain of a CMOS device are formed at end portions of a channel structure by plasma doping end portions of the channel structure above solid state solubility of the channel structure, and annealing the end portions for liquid phase epitaxy and activation (e.g., superactivation). In this manner, the source and drain can be integrally formed in the end portions of the channel structure to provide coextensive surface area contact between the source and drain and the channel structure for lower channel contact resistance. This is opposed to forming the source/drain using epitaxial growth that provides an overgrowth beyond the end portion surface area of the channel structure to reduce channel contact resistance, which may short adjacent channels structures.

21 Claims, 10 Drawing Sheets

(51) Int. Cl.
*H01L 29/66* (2006.01)
*H01L 21/8238* (2006.01)

(52) U.S. Cl.
CPC ............... *H01L 21/823871* (2013.01); *H01L 2029/7858* (2013.01)

(56) References Cited

U.S. PATENT DOCUMENTS

| | | |
|---|---|---|
| 8,853,008 B1 | 10/2014 | Lee |
| 8,969,963 B2 | 3/2015 | Basker et al. |
| 9,553,025 B2 | 1/2017 | Wann et al. |
| 2006/0011984 A1* | 1/2006 | Currie ............... H01L 21/76254 257/352 |
| 2012/0108042 A1* | 5/2012 | Liu .................... H01L 21/2236 438/513 |
| 2016/0211324 A1* | 7/2016 | Qin .................... H01L 29/0847 |

\* cited by examiner

COMPLEMENTARY METAL OXIDE SEMICONDUCTOR (CMOS) DEVICES EMPLOYING PLASMA-DOPED SOURCE/DRAIN STRUCTURES AND RELATED METHODS

PRIORITY CLAIM

The present application claims priority under 35 U.S.C. § 119(e) to U.S. Provisional Patent Application Ser. No. 62/345,335 filed on Jun. 3, 2016 and entitled "COMPLEMENTARY METAL OXIDE SEMICONDUCTOR (CMOS) DEVICES EMPLOYING PLASMA-DOPED SOURCE/DRAIN STRUCTURES," the contents of which is incorporated herein by reference in its entirety.

BACKGROUND

I. Field of the Disclosure

The technology of the disclosure relates generally to fabrication of complementary metal oxide semiconductor (CMOS) devices, and more specifically, to forming source/drain structures in CMOS devices.

II. Background

Transistors are essential components in modern electronic devices, and large numbers of transistors are employed in integrated circuits (ICs) therein. For example, components such as central processing units (CPUs) and memory systems each employ a large quantity of transistors for logic circuits and memory devices.

As electronic devices become more complex in functionality, so does the need to include a greater number of transistors in such devices. But as electronic devices are provided in increasingly smaller packages, such as in mobile devices for example, there is a need to provide a greater number of transistors in a smaller IC chip. This increase in the number of transistors is achieved in part through continued efforts to miniaturize transistors in ICs (i.e., placing increasingly more transistors into the same amount of space). As a result, gate lengths are also scalably reduced, thereby reducing channel length of the transistors and interconnects. This reduction in gate length has created a need to move from planar transistors into gate all around (GAA) transistors. In particular, as channel length in planar transistors is reduced such that the channel length is of the same order of magnitude as depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths), and therefore, reduced gate control.

In this regard, GAA transistors have been developed. In GAA transistors, gate material wraps around at least a portion of a channel structure to provide better gate control over an active channel therein. Better gate control provides reduced current leakage and increased threshold voltage compared to a planar transistor of a similar footprint. An example is a complementary metal oxide semiconductor (CMOS) fin field effect transistor (FET) (FinFET). A FinFET provides a channel structure formed by thin silicon (Si) "fins," and a gate that wraps around portions of the fins. FIG. 1 illustrates a conventional CMOS FinFET 100 ("FinFET 100") as an example. The FinFET 100 includes a substrate 102 and fins 104A and 104B disposed above the substrate 102 to form a semiconductor material structure 106 across the FinFET 100. The fins 104A and 104B are made of a semiconductor material, such as Silicon (Si) for example.

The FinFET 100 further includes source/drain elements 108A, 108B disposed above the fins 104A and 104B, respectively, to provide a source/drain to the FinFET 100. It is noted that similar source/drain elements are disposed on a side 110 of the FinFET 100, but are not shown in FIG. 1 for the sake of clarity. The FinFET 100 further includes a source/drain contact 112 disposed on the substrate 102 to provide a contact to the source/drain elements 108A, 108B. The FinFET 100 further includes a source/drain contact 114 to provide a contact to the source/drain regions (not shown) disposed on the side 110 of the FinFET 100. The FinFET 100 further includes spacer layers 116A and 116B disposed on the substrate 102 to isolate the source/drain contacts 112, 114, respectively, from a "wrap-around" gate 118 disposed over the fins 104A and 104B. The spacer layers 116A and 116B may be a Nitride-based low-k gate spacer or an air spacer. The FinFET 100 further includes the gate 118 disposed on the substrate 102 and above the fins 104A and 104B between the spacer layers 116A and 116B. The FinFET 100 further includes a gate contact 120 disposed on the gate 118 to provide a contact to the gate 118. The FinFET 100 further includes an interlayer dielectric (ILD) 122 to isolate active components of the FinFET 100 from other devices disposed near the FinFET 100. It is noted that, as used herein, the term "source/drain element" denotes that the "element" can be either a source or a drain of a corresponding CMOS device based on how the CMOS device is connected in the circuit, since the conduction channel has no intrinsic polarity.

With continuing reference to FIG. 1, the source/drain elements therein, such as source/drain element 108A, are grown on the fin 104A using an epitaxial process. Conventionally, epitaxially grown source/drain elements, such as source/drain elements 108A and 202A illustrated in FIG. 2, have been used to provide low contact resistance and channel strain. Contact resistance is a limiting factor in fabrication of CMOS devices, with high contact resistance resulting in degradation of performance, errors in data, and increase heat and power loss, to name a few effects. It is desirable then to achieve low contact resistance. A low contact resistance is obtained in a CMOS device, such as FinFET 100, by having as large as possible a contact area between a source/drain region, such as source/drain region 108A, and a channel structure therein, such as fin 104A.

In this regard, FIG. 2 illustrates in further detail the source/drain element 108A of the FinFET 100 illustrated in FIG. 1. As illustrated in FIG. 2, the channel structure of the FinFET 100, i.e., the fin 104A, is very thin. Thus, merely disposing a source/drain region (not shown) above the fin 104A in contact with a top portion 202 of the fin 104A will provide a relatively large contact resistance. Accordingly, in the FinFET 100, epitaxial growth is employed above and around the fin 104A to provide oversized source/drain elements 108A, 204A that cover the top portion 202 and side portions 206, 208 of the fin 104A.

The use of controlled mechanical strain is widely used to boost mobility. In FIG. 2, the source/drain element 108A, in conjunction with the counterpart source/drain region 204A, provide a channel strain to the FinFET 100. In particular, source/drain element 108A and 204A can be configured to provide compressive stress when the FinFET 100 is a p-type MOS (pMOS) FinFET, and tensile stress when the FinFET 100 is an n-type MOS (nMOS) FinFET. Providing the appropriate channel strain improves mobility and speed of the FinFET 100. For example, the source/drain elements 108A, 204A can include Silicon Germanium (SiGe) because Germanium (Ge) has an atom larger than Silicon (Si), and therefore, will push the Silicon (Si) channel structure towards the center of the FinFET 100, thus providing compressive stress to the channel Accordingly, epitaxially growing the source/drain elements 108A and 204A on the fin 104A provides low contact resistance and desirable channel strain, thus improving performance of the FinFET 100.

Further scaling down of CMOS devices, however, has reduced the effective epitaxial growth of source/drain regions. For example, with reference back to FIG. 1, scaling down of a CMOS device, such as FinFET 100 illustrated in FIG. 1, can include reducing a fin pitch 124. Reducing the fin pitch 124, for example to 24 nanometers (nm) or below, may cause the source/drain element 108A to contact and short a source/drain region of an adjacent CMOS device (not shown). Although such effect may be countered by reducing the size of the adjacent source/drain regions to maintain a separation therein, reducing the size of the source/drain region also reduces the contact area between the source/drain region and a corresponding channel structure. This increases contact resistance, which may result in loss of performance, errors in data, and increased heat and power loss, to name a few effects. Scaling down of a CMOS device may further include reducing a fin width 126. However, reducing the fin width 126 also reduces the contact area between the source/drain region and a corresponding channel structure which, as noted earlier, increases contact resistance and may result in loss of performance, errors in data, and increased heat and power loss. Furthermore, growing the epitaxial source/drain element in a narrower fin 104A, 104B makes it difficult to confine the volume of the source/drain element to the body of the fin 104A, 104B, for example Silicon (Si). This, in turn, makes it difficult for the source/drain region to have the necessary mechanical support in the fin 104A, 104B to provide an adequate channel strain to the channel structure therein, resulting in a weaker channel strain, and thus reducing mobility and speed of the transistor.

SUMMARY OF THE DISCLOSURE

Aspects disclosed in the detailed description include complementary metal oxide semiconductor (CMOS) devices employing plasma-doped source/drain structures and related methods. In certain aspects, a source and a drain of a CMOS device are formed at end portions of a channel structure by plasma doping end portions of the channel structure. In particular, the end portions of the channel structure are plasma-doped above a solid state solubility of the channel structure and annealed for liquid phase epitaxy and activation (e.g., superactivation) to form the source and drain of the CMOS device. In this manner, the source and drain can be integrally formed in the end portions of the channel structure to provide coextensive surface area contact between the source and drain and the channel structure to provide lower channel contact resistance. This is opposed to, for example, a source and drain formed using epitaxial growth that provides an overgrowth beyond the end portions of a surface area of the channel structure to offset a scaled down layout design with a reduced channel structure width, and which may then risk shorting adjacent channels structures at a scaled down channel structure pitch. Further, by providing integrally formed source and drains in the end portions of the channel structure, a stressed contact fill metal may be more easily disposed on the source and drain adjacent to the channel structure to enhance channel strain on the channel structure to increase carrier mobility performance.

In this regard in one aspect, a CMOS device is provided. The CMOS device comprises a substrate, and a semiconductor material structure disposed above the substrate. The semiconductor material structure comprises one or more channel structures. Each channel structure comprises a semiconductor material having a first end portion and a second end portion. Each channel structure also comprises a source in the first end portion. The source comprises a first plasma-doped portion of the semiconductor material at the first end portion. Each channel structure also comprises a drain in the second end portion of the semiconductor material. The drain comprises a second plasma-doped portion of the semiconductor material at the second end portion. Each channel structure further comprises a channel disposed between the source and the drain. The CMOS device also comprises a gate material disposed proximate to the channel.

In another aspect, a method of fabricating a CMOS device. The method comprises providing a semiconductor die for the CMOS device. The CMOS device comprises a substrate, and a semiconductor material structure disposed above the substrate. The semiconductor material structure comprises one or more channel structures to form a channel, and a sacrificial gate formed on the substrate above the semiconductor material structure. The method further comprises plasma doping above a solid state solubility of the semiconductor material structure, and annealing a first end portion of the one or more channel structures to activate the first end portion to form a source. The method further comprises plasma doping above the solid state solubility of the semiconductor material structure, and annealing a second end portion of the one or more channel structures to activate the second end portion to form a drain.

DETAILED DESCRIPTION

Figure 1:
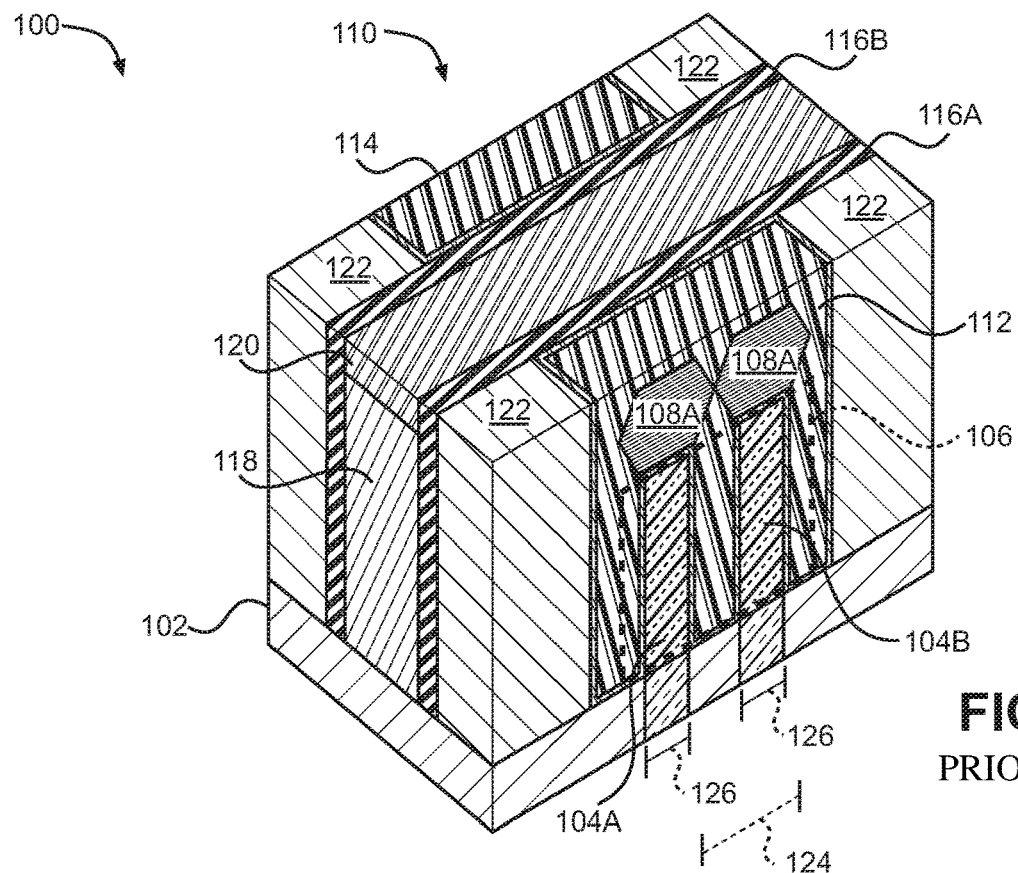
FIG. 1 illustrates a conventional complementary metal oxide semiconductor (CMOS) fin field-effect transistor (FET) (FinFET)
Figure 2:
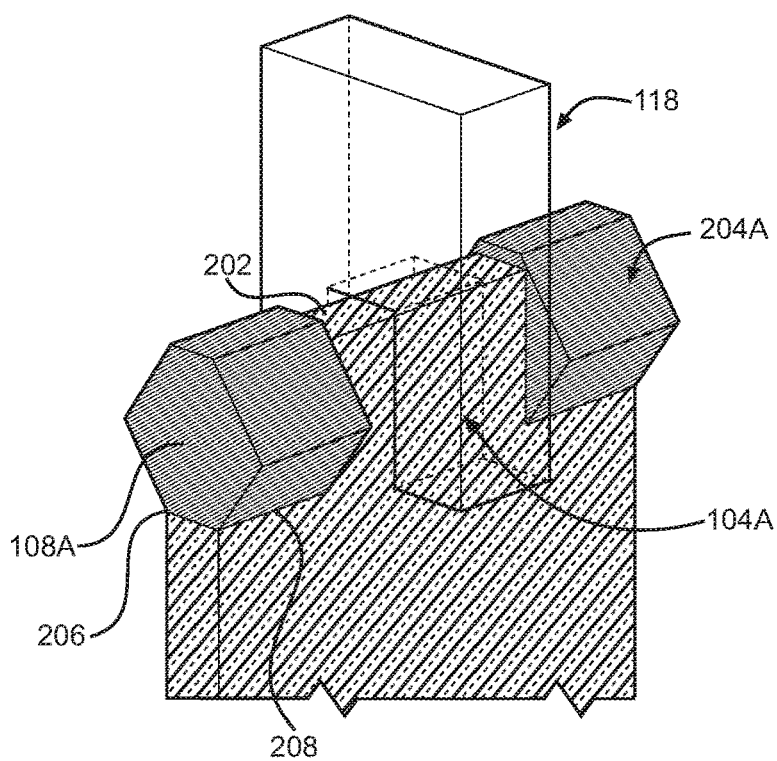
FIG. 2 illustrates a source/drain region of the conventional FinFET illustrated in FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include complementary metal oxide semiconductor (CMOS) devices employing plasma-doped source/drain structures and related methods. In certain aspects, a source and a drain of a CMOS device are formed at end portions of a channel structure by plasma doping end portions of the channel structure. In particular, the end portions of the channel structure are plasma-doped above a solid state solubility of the channel structure and annealed for liquid phase epitaxy and activation (e.g., superactivation) to form the source and drain of the CMOS device. In this manner, the source and drain can be integrally formed in the end portions of the channel structure to provide coextensive surface area contact between the source and drain and the channel structure to provide lower channel contact resistance. This is opposed to, for example, a source and drain formed using epitaxial growth that provides an overgrowth beyond the end portions of a surface area of the channel structure to offset a scaled down layout design with a reduced channel structure width, and which may then risk shorting adjacent channels structures at a scaled down channel structure pitch. Further, by providing integrally formed source and drains in the end portions of the channel structure, a stressed contact fill metal may be more easily disposed on the source and drain adjacent to the channel structure to enhance channel strain on the channel structure to increase carrier mobility performance.

Figure 3A:
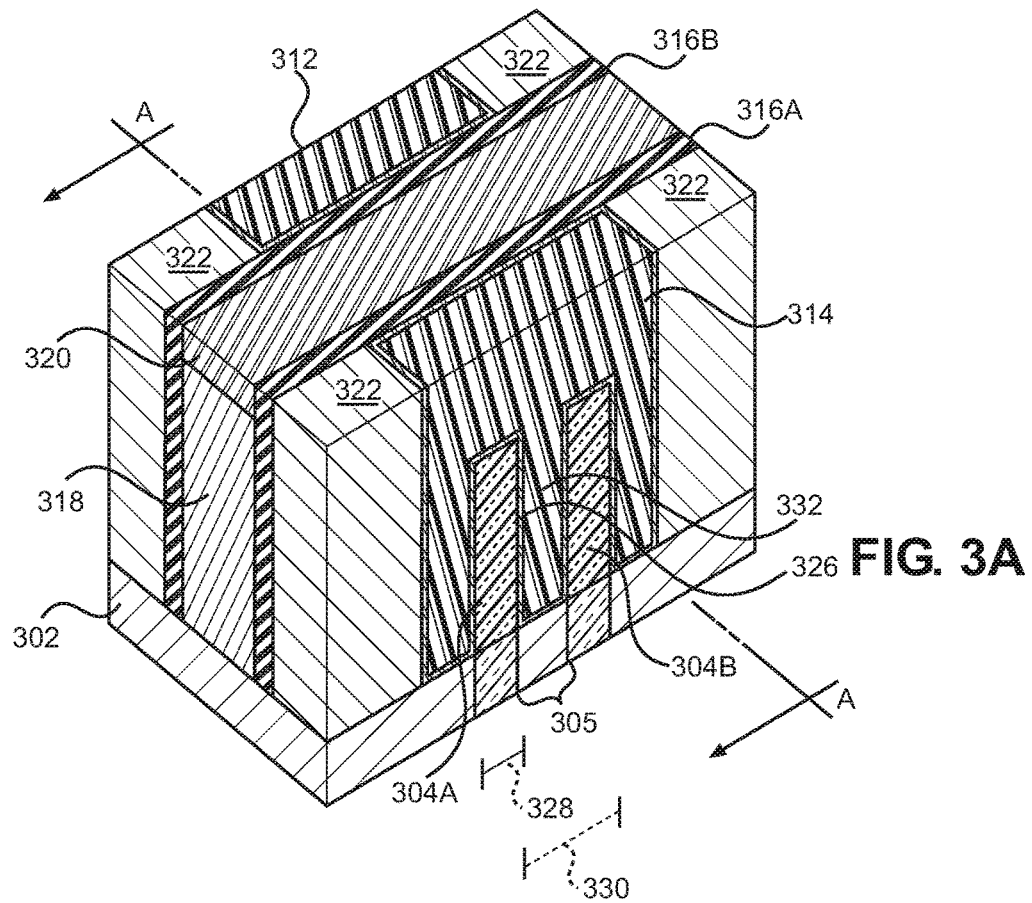
FIGS. 3A and 3B illustrate profile and cross section views of an exemplary CMOS device employing plasma-doped source/drain structures to facilitate lower channel contact resistance with a downscaled channel structure width and/or pitch, as compared to a conventional FinFET.
Figure 3B:
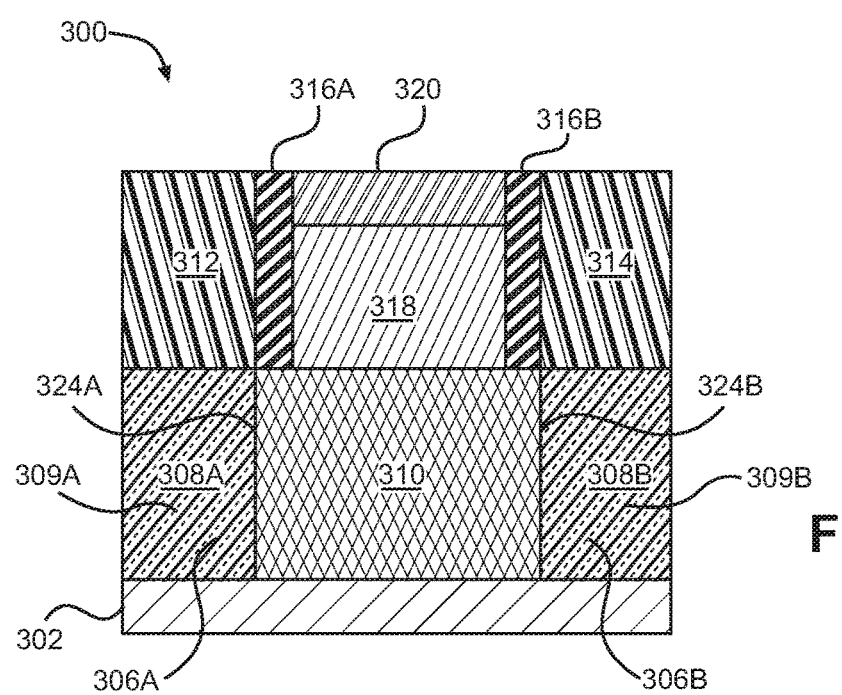

In this regard, FIGS. 3A and 3B illustrate profile and cross section views, respectively, of an exemplary CMOS device 300 employing plasma-doped source/drain structures to facilitate lower channel contact resistance with a down-scaled channel structure width and/or pitch, as compared to the conventional FinFET 100 illustrated in FIG. 1. The CMOS device 300 includes a substrate 302 and channel structures 304A and 304B disposed above the substrate 302 to form a semiconductor material structure 305 across the CMOS device 300. In FIG. 3A, the channel structures 304A, 304B are illustrated as fins. It is noted, however, that channel structures according to the present disclosure are not so limited, and may include other structures such as nanowires, for example. The channel structures 304A, 304B are made of a semiconductor material, such as Silicon (Si) for example. FIG. 3B illustrates in further detail the channel structure 304A.

As illustrated in FIG. 3B, the channel structure 304A includes a first end portion 306A and a second end portion 306B. The first end portion 306A includes a source/drain element 308A that is formed by plasma doping the first end portion 306A above a solid state solubility of the channel structure 304A, and by annealing (e.g., layer annealing) the first end portion 306A for liquid phase epitaxy and activation (e.g., superactivation). In particular, in plasma doping, a target material is immersed in a plasma containing dopant ions (i.e., plasma material) such as, for example, Arsenic (As) and Phosphorus (P) for n-type MOS (NMOS) devices, and Boron (B) for p-type MOS (PMOS) devices. The target material may be, for example, one of Silicon Arsenide (SiAs), Silicon Phosphorus (SiP), Silicon Germanium Arsenide (SiGeAs), Silicon Germanium Phosphorus (SiGeP), Silicon Carbon Arsenide (SiCAs), Silicon Carbon Phosphorus (SiCP), Germanium Arsenide (GeAs), or Germanium Phosphorus (GeP) for NMOS devices, and one of Silicon Boron (SiB), Silicon Germanium Boron (SiGeB), Germanium Boron (GeB), and Germanium Tin Boron (GeSnB) for PMOS devices. The target material is biased with a series of negative voltage pulses. The electric field within a plasma sheath accelerates ions towards the target material which implants the ions into a surface of the target material. This allows the doping of the target material, for example the channel structure 304A, to be doped above its solid state solubility, and thus, to serve as a source/drain of the CMOS device 300.

In this manner, the source/drain element 308A is integrally formed in the first end portion 306A of the channel structure 304A to form a source 309A in this example for the CMOS device 300. Thus, the source 309A formed by plasma-doping the channel structure 304A has a coextensive or substantially coextensive surface area contact with the channel structure 304A. Furthermore, the second end portion 306B includes a source/drain element 308B that is formed in the second end portion 306B in the manner described above with respect to the source/drain element 308A. Thus, the source/drain element 308B is also integrally formed in the second end portion 306B of the channel structure 304A to form a drain 309B in this example for the CMOS device 300. Thus, the drain 309B formed by plasma-doping the channel structure 304A has a coextensive substantially coextensive surface area contact with the channel structure 304A.

With continued reference to FIG. 3B, the channel structure 304A further includes a channel 310 disposed between the source/drain element 308A and the source/drain element 308B. In particular, the channel 310 is a center portion of the channel structure 304A that has not been exposed to the plasma doping process performed on the first and second end portions 306A, 306B. Accordingly, the channel 310 is made of the same semiconductor material as the channel structure 304A, such as Silicon (Si) for example. It is noted that the channel structure 304B of the CMOS device 300 also includes source/drain elements and a channel that are similar to the source/drain elements 308A, 308B and the channel 310 described above for the channel structure 304A. However, these elements of the channel structure 304B are not illustrated in FIGS. 3A and 3B for the sake of clarity. The CMOS device 300 further includes source/drain stressed contact fill metals 312 and 314 disposed on the substrate 302 and above the channel structures 304A and 304B. The source/drain stressed contact fill metals 312 and 314 provide a contact to the source/drain elements 308A, 308B of the channel structures 304A and 304B. For example, with reference to FIG. 3B, the source/drain stressed contact fill metals 312 and 314 provide contacts to the source/drain element 308A and the source/drain element 308B, respectively, of the channel structure 304A. Since the source/drain element 308A forms the source 309A in this example, the source/drain stressed contact fill metal 312 can also be referred to as "source stressed contact fill metal 312." Similarly, since the source/drain element 308B forms the drain 309B in this example, the source/drain stressed contact fill metal 314 can also be referred to as "drain stressed contact fill metal 314." With continued reference to FIGS. 3A and 3B, the CMOS device 300 further includes spacer layers 316A and 316B disposed on the substrate 302 to isolate the source/drain stressed contact fill metals 312, 314, respectively, from a "wrap-around" gate 318 disposed proximate and adjacent to the channel structures 304A and 304B. The spacer layers 316A and 316B may be a Nitride-based low-k gate spacer or an air spacer. The CMOS device 300 further includes the gate 318 disposed on the substrate 302, proximate and adjacent to the channel structures 304A and 304B, and between the spacer layers 316A and 316B. The CMOS device 300 further includes a gate contact 320 disposed on the gate 318 to provide a contact to the gate 318. The CMOS device 300 further includes an interlayer dielectric (ILD) 322 to isolate active components of the CMOS device 300 from other devices disposed near the CMOS device 300.

Accordingly, as illustrated in FIGS. 3A and 3B, in the CMOS device 300, the source/drain elements, for example the source/drain elements 308A, 308B illustrated in FIG. 3B, are formed at end portions of a channel structure, such as the end portions 306A, 306B of the channel structure 304A. This is achieved by plasma doping the end portions 306A, 306B above the solid state solubility of the semiconductor material of the channel structure 304A, and by annealing (e.g., laser annealing) for liquid phase epitaxy and activation (e.g., superactivation) to form the source/drain elements 308A, 308B. In this manner, the source/drain elements 308A, 308B are integrally formed in the first end portion 306A of the channel structure 304A to provide coextensive surface area contact areas 324A and 324B ("contact areas 324A, 324B") between the source/drain elements 308A, 308B and the channel 310 of the channel structure 304A. The contact areas 324A, 324B provide coextensive surface area and lower channel contact resistance. Specifically, as illustrated in FIG. 3B, the area of each of the contact areas 324A, 324B corresponds to the cross section of the channel structure 304A, i.e., a channel structure height 326 and a channel structure width 328. The source 309A and drain 309B are non-epitaxial structures. An epitaxial-grown source and drain would provide an overgrowth beyond the end portion 306A, 306B of the surface area of the channel structure 304A, 304B to offset a scaled down layout design with a reduced channel structure width, which may then risk shorting adjacent channel structures at a scaled down channel structure pitch.

Furthermore, by the source/drain elements 308A, 308B of the CMOS device 300 being integrally formed in the first end portion 306A of the channel structure 304A, the material of the source/drain stressed contact fill metals 312, 314 can be easily disposed between adjacent fins. For example, with reference to FIG. 3A, because the source/drain elements 308A, 308B of the CMOS device 300 are integrally formed in their corresponding channel structures 304A, 304B, the stressed contact fill material of the source/drain stressed contact fill metals 312, 314 can be easily disposed between an area 332 between the adjacent channel structures 304A, 304B. This allows the stressed contact fill material of the source/drain stressed contact fill metals 312, 314 to have more area to provide channel strain on the channel structure 304A, 304B to increase carrier mobility performance, thus obviating the need for having epitaxial regions to do so.

Figure 4:
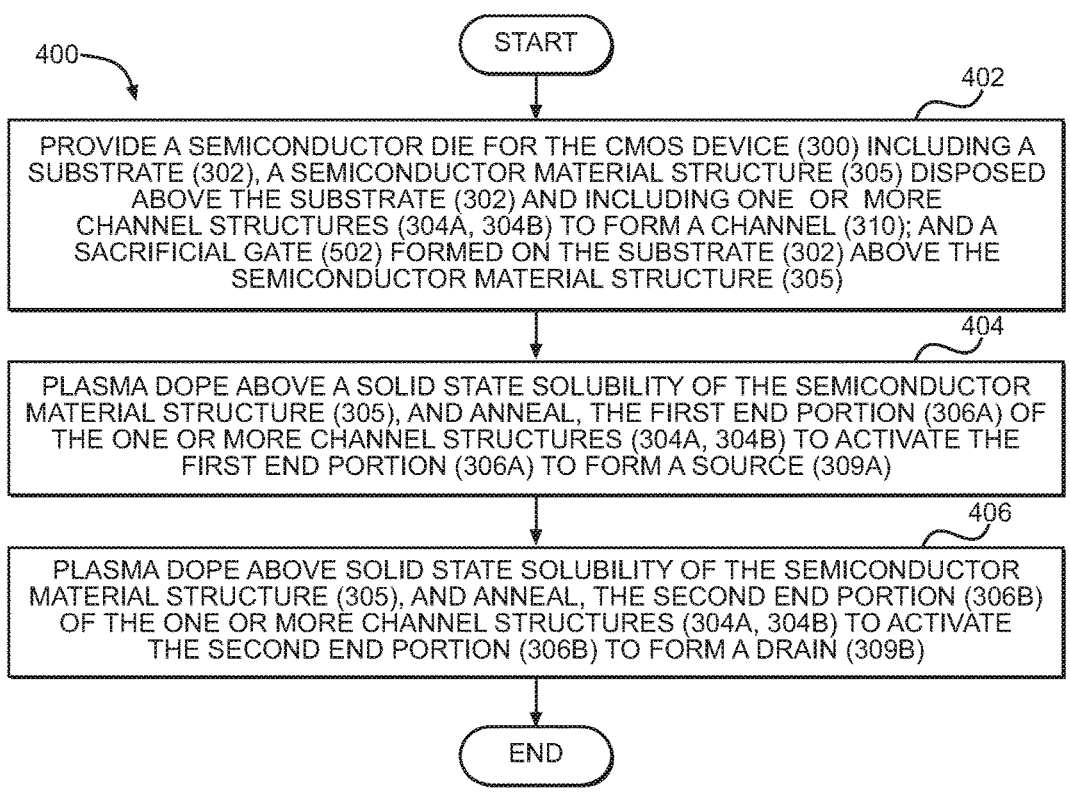
FIG. 4 is a flowchart illustrating an exemplary process for fabricating the exemplary CMOS device illustrated in FIGS. 3A and 3B.

FIG. 4 is a flowchart illustrating an exemplary process 400 for fabricating the exemplary CMOS device 300 illustrated in FIG. 3. The steps in the process 400 are illustrated respectively in FIGS. 5-16. FIGS. 5-16 will be referenced as the exemplary steps in the process 400 in FIG. 4 as described below.

Figure 5:
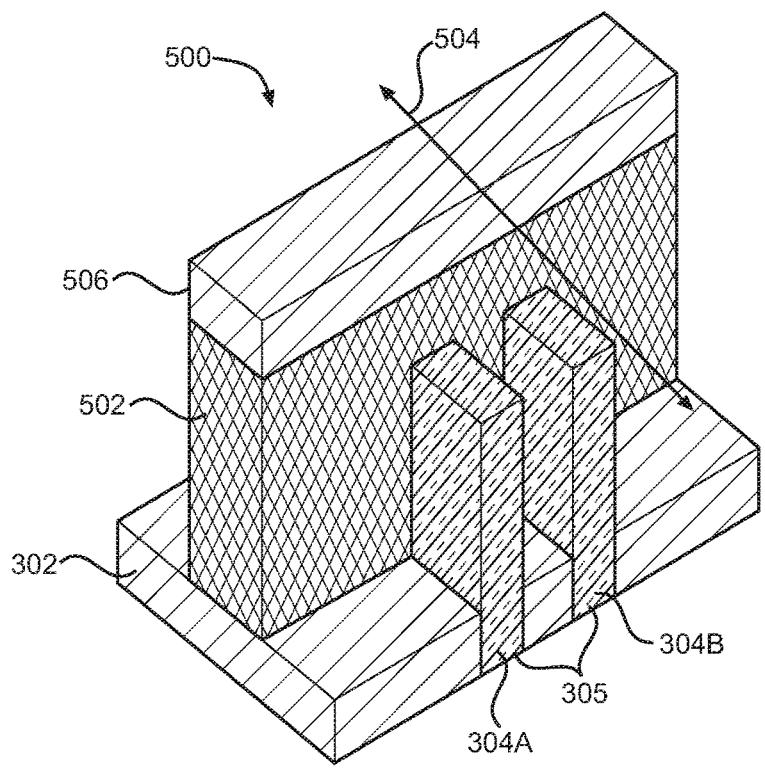
FIG. 5 is a profile diagram of an exemplary fabrication process of disposing a sacrificial gate over a substrate and a channel structure for fabricating the exemplary CMOS device illustrated in FIGS. 3A and 3B.

In block 402 of the process 400, a semiconductor die is provided comprising a substrate 302, a semiconductor material structure 305 disposed above the substrate 302 and including one or more channel structures 304A and 304B to form the channel 310. Furthermore, a sacrificial gate 502 is formed on the substrate 302 above the semiconductor material structure 305. FIG. 5 is a profile diagram of a stage 500 of the exemplary process 400 of disposing the sacrificial gate 502 gate over the substrate 302 and the channel structure 304A, 304B for fabricating the exemplary CMOS device 300. Thus, the stage 500 illustrates the substrate 302, the semiconductor material structure 305 disposed above the substrate 302 and including one or more channel structures 304A and 304B. The semiconductor material structure 305 is disposed to have a longitudinal axis 504 above the substrate 302. The stage 500 further illustrates the sacrificial gate 502 formed on the substrate 302 above the semiconductor material structure 305. The sacrificial gate 502 is formed instead of disposing a gate material for the gate 318 (shown in FIG. 3A) to protect the gate 318 from a thermal process in later steps in the process 400. The stage 500 further illustrates a hard mask 506 disposed on the sacrificial gate 502 to protect the sacrificial gate 502, and a portion of the semiconductor material structure 305, from later steps in the process 400.

Figure 6:
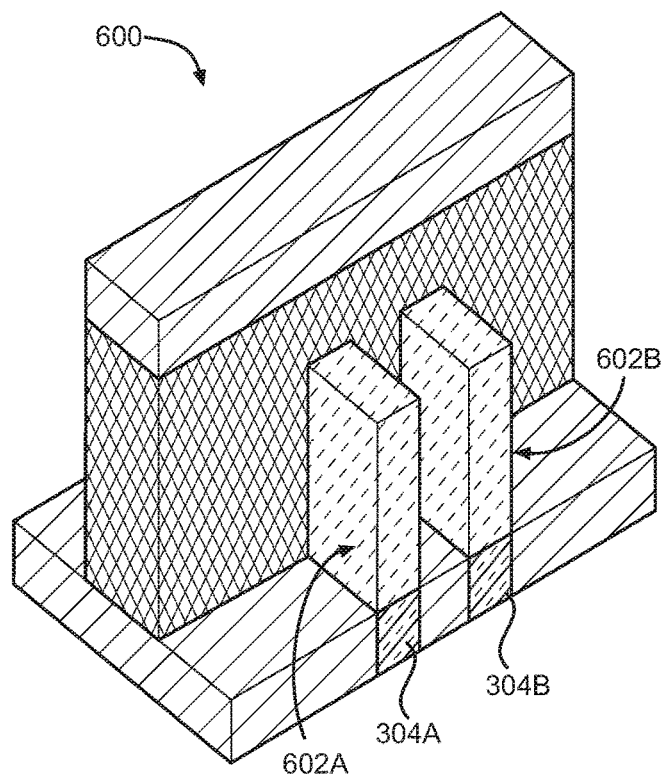
FIG. 6 is a profile diagram of an exemplary fabrication process of doping an end portion of a channel structure for fabricating the exemplary CMOS device illustrated in FIGS. 3A and 3B.

FIG. 6 is a profile diagram of a stage 600 of the exemplary process 400 of doping the first and second end portions 306A, 306B of the semiconductor material structure 305 for fabricating the exemplary CMOS device 300. The stage 600 illustrates the channel structures 304A, 304B after being doped with a first dopant, the doping being represented by shading 602A and 602B, respectively. The first dopant may comprise Arsenic (As) or Phosphorus (P) when the CMOS device 300 is an NMOS device, and Boron (B) when the CMOS device 300 is a PMOS device.

Figure 7:
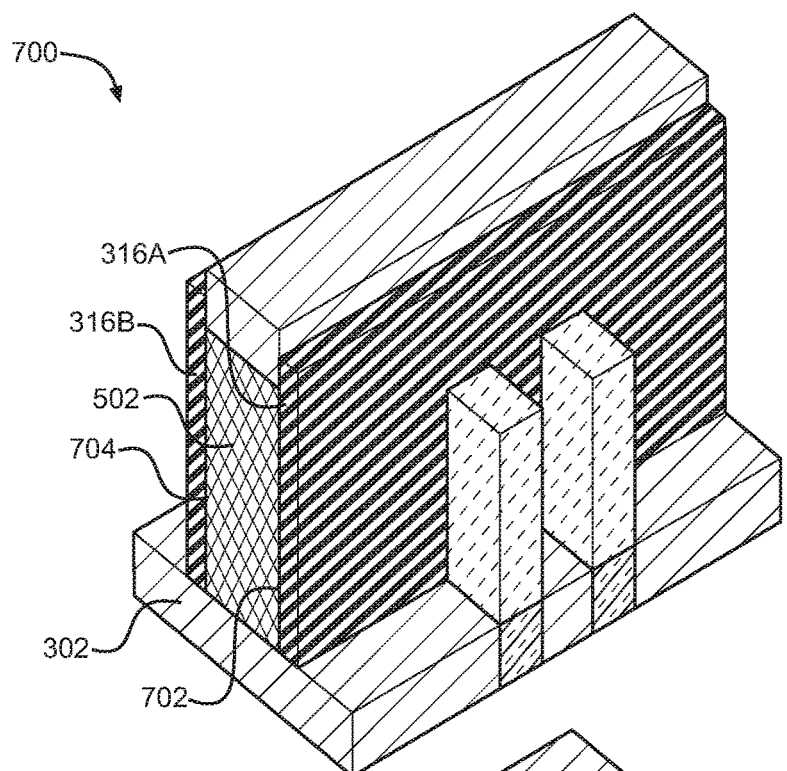
FIG. 7 is a profile diagram of an exemplary fabrication process of disposing spacer layers for fabricating the exemplary CMOS device illustrated in FIGS. 3A and 3B.

FIG. 7 is a profile diagram of a stage 700 illustrating a step of disposing the spacer layers 316A and 316B for fabricating the exemplary CMOS device 300. In particular, stage 700 illustrates disposing of the spacer layer 316A on the substrate 302, adjacent to a first side 702 of the sacrificial gate 502, and disposing the spacer layer 316B on the substrate 302, adjacent to a second side 704 of the sacrificial gate 502. The spacer layers 316A and 316B are disposed on the substrate 302 to isolate the source/drain stressed contact fill metals 312, 314, respectively, which will be disposed in a later step, from the gate 318, which will also be disposed in a later step proximate and adjacent to the channel structures 304A and 304B. The spacer layers 316A, 316B may be a Nitride-based low-k gate spacer or an air spacer.

Figure 8:
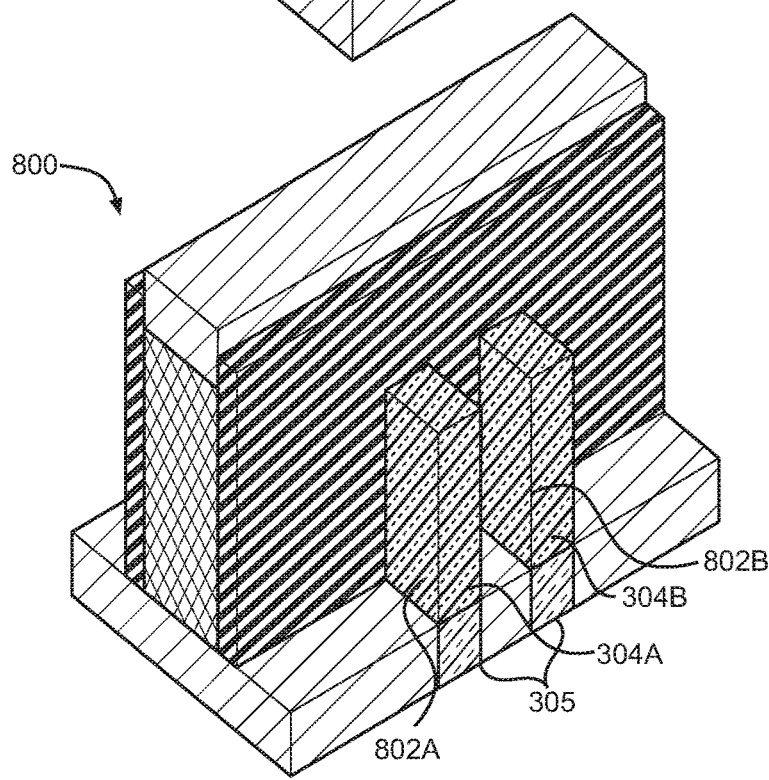
FIG. 8 is a profile diagram of an exemplary fabrication process of plasma doping and annealing end portions of a channel structure for fabricating the exemplary CMOS device illustrated in FIGS. 3A and 3B.

In block 404 of the process 400, the first end portion 306A of the one or more channel structures 304A, 304B is plasma doped above a solid state solubility of the semiconductor material structure 305, and annealed (e.g., laser annealed) to provide a liquid phase epitaxy for activation of the first end portion 306A to form a source 309A for the CMOS device 300. Furthermore, in block 406 of the process 400, the second end portion 306B of the one or more channel structures 304A, 304B is also plasma doped above a solid state solubility of the semiconductor material structure 305, and annealed (e.g., laser annealed) to provide a liquid phase epitaxy for activation of the second end portion 306B to form a drain 309B for the CMOS device 300. FIG. 8 is a profile diagram of a stage 800 of the exemplary process 400 of plasma doping and annealing the first and second end portions 306A, 306B of a channel structure 304A, 304B for fabricating the exemplary CMOS device 300. As noted earlier, in plasma doping, a target material is immersed in a plasma containing dopant ions (i.e., plasma material) such as, for example, Arsenic (As) and Phosphorus (P) for n-type MOS (NMOS) devices, and Boron (B) for p-type MOS (PMOS) devices. The target material is biased with a series of negative voltage pulses. The electric field within a plasma sheath accelerates ions towards the target material which implants the ions into a surface of the target material. This allows the doping of the target material, for example the first and second end portions 306A, 306B of the channel structure 304A, 304B, to be doped above its solid state solubility and annealed, and thus, to serve as a source/drain of the CMOS device 300. In this regard, the stage 800 illustrates the channel structures 304A, 304B after being plasma doped and annealed, the doping and annealing process represented by shading 802A and 802B, respectively.

Figure 9:
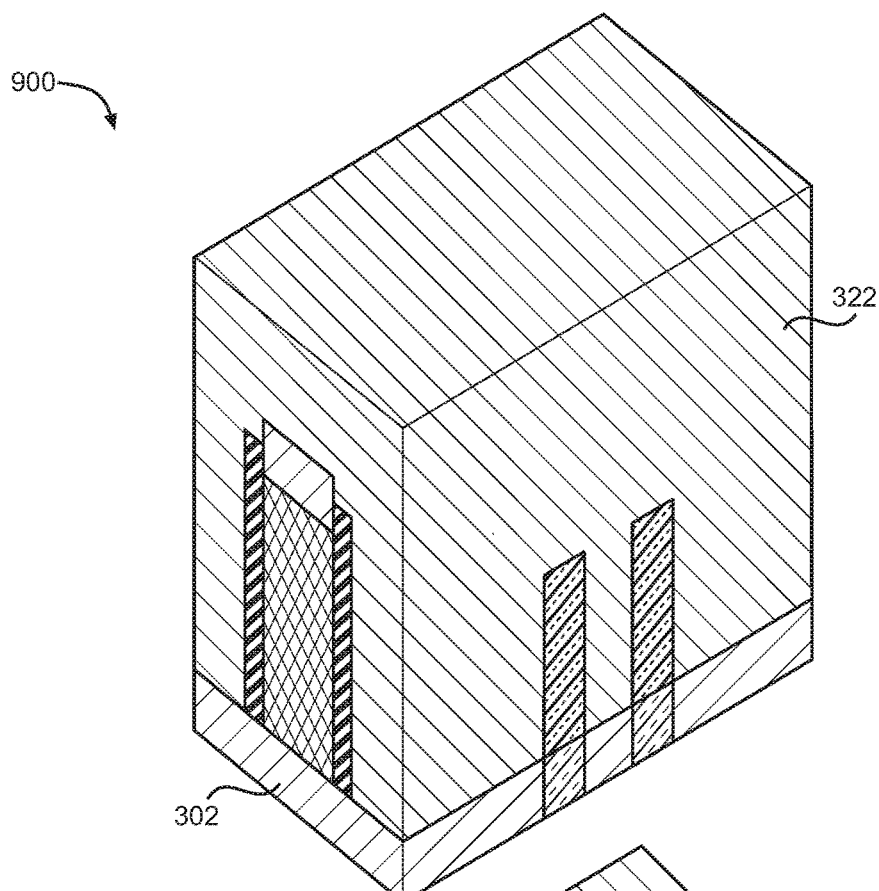
FIG. 9 is a profile diagram of an exemplary fabrication process of disposing an interlayer dielectric (ILD) for fabricating the exemplary CMOS device illustrated in FIGS. 3A and 3B.
Figure 10:
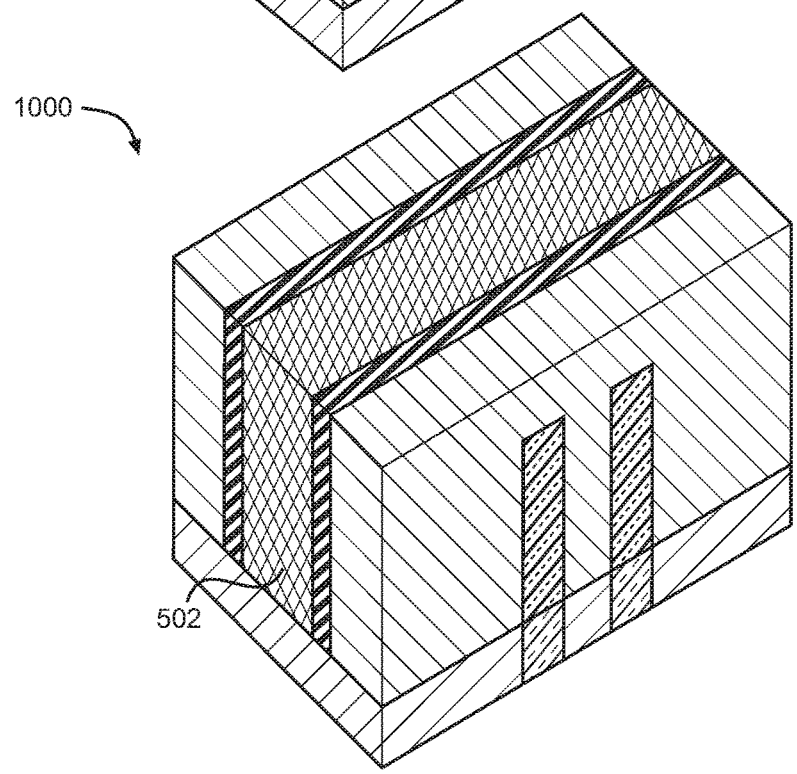
FIG. 10 is a profile diagram of an exemplary fabrication process of chemical mechanical planarizing an interlayer dielectric (ILD) down to a sacrificial gate for fabricating the exemplary CMOS device illustrated in FIGS. 3A and 3B.

FIG. 9 is a profile diagram of a stage 900 illustrating a step of disposing an interlayer dielectric (ILD) 322 for fabricating the exemplary CMOS device 300. The interlayer dielectric (ILD) 322 is disposed above the substrate 302 to isolate active components of the CMOS device 300 from other devices disposed near the CMOS device 300 in a corresponding semiconductor die. FIG. 10 is a profile diagram of a stage 1000 illustrating a step of chemical mechanical planarizing of the interlayer dielectric (ILD) 322 down to the sacrificial gate 502. This allows access to the sacrificial gate 502 to replace the sacrificial gate 502 with the gate 318 at a later step, while still providing interlayer dielectric (ILD) 322 protection to the active components of the CMOS device 300.

Figure 11:
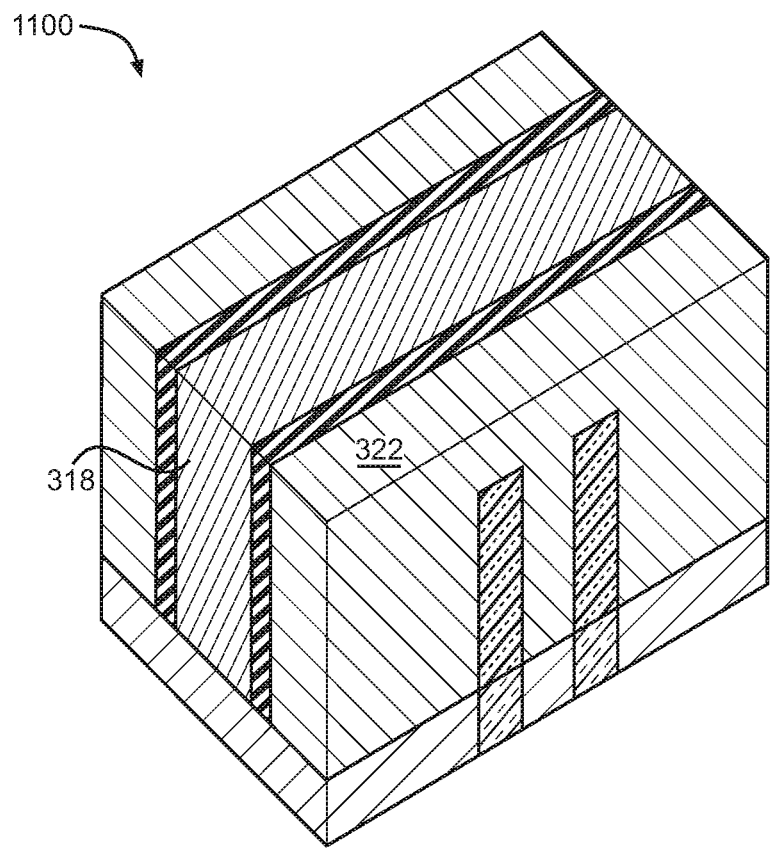
FIG. 11 is a profile diagram of an exemplary fabrication process of replacing a dummy gate for a gate for fabricating the exemplary CMOS device illustrated in FIGS. 3A and 3B.

FIG. 11 is a profile diagram of a stage 1100 illustrating replacing the sacrificial gate 502 for the gate 318 for fabricating the exemplary CMOS device 300. In particular, a replacement gate process is performed in which the sacrificial gate 502 is removed to form the gate 318 and exposing the gate 318 using a chemical mechanical planarization process that stops on the interlayer dielectric (ILD) 322.

Figure 12:
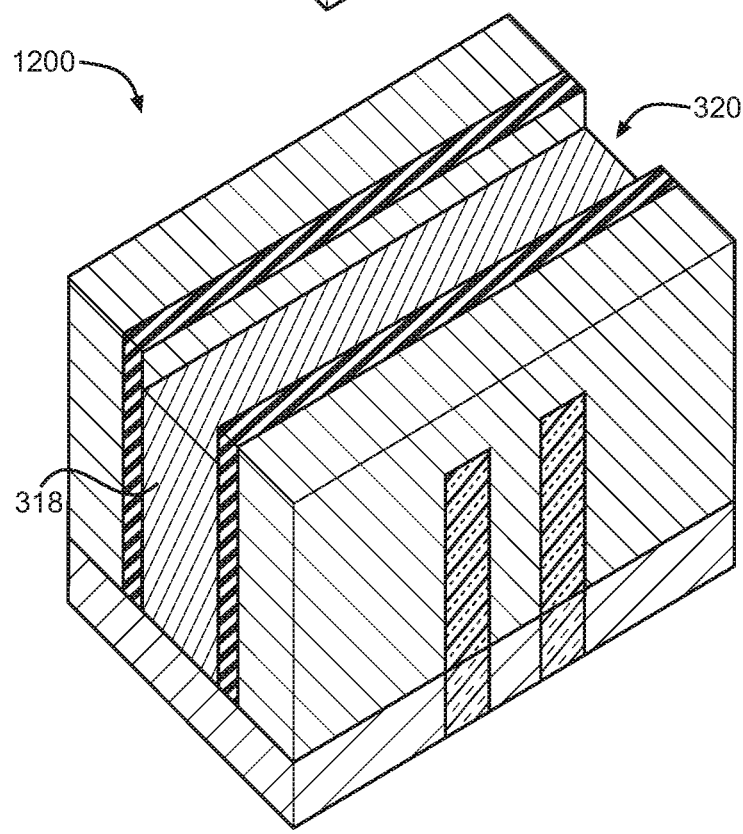
FIG. 12 is a profile diagram of an exemplary fabrication process of etching a gate to provide a recess area for disposing a gate contact in a later step for fabricating the exemplary CMOS device illustrated in FIGS. 3A and 3B.

FIG. 12 is a profile diagram of a stage 1200 illustrating etching the gate 318 to provide a recess area for disposing a gate contact 320 in a later step for fabricating the exemplary CMOS device 300. The gate contact 320 provides a contact to the gate 318 for receiving signals to control, for example, the channel 310 of the channel structure 304A, as illustrated in FIG. 3B.

Figure 13:
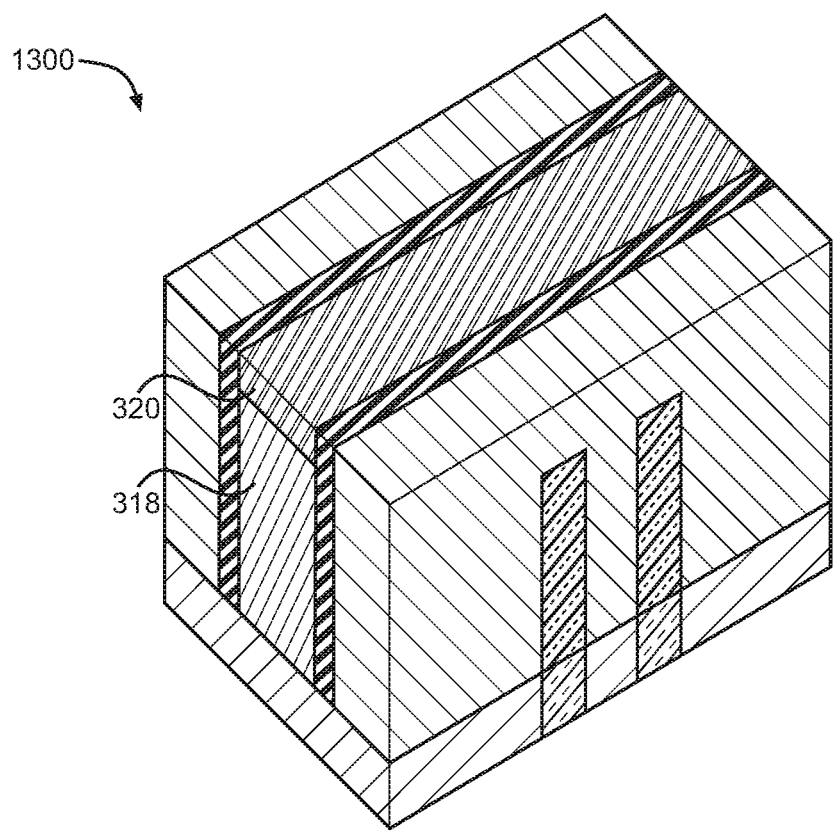
FIG. 13 is a profile diagram of an exemplary fabrication process of disposing a gate contact and polishing, by chemical mechanical planarization, the gate contact for fabricating the exemplary CMOS device illustrated in FIGS. 3A and 3B.

FIG. 13 is a profile diagram of a stage 1300 illustrating disposing the gate contact 320 and polishing, by chemical mechanical planarization, the gate contact 320 for fabricating the exemplary CMOS device 300. As noted earlier, the gate contact 320 provides a contact to the gate 318 for receiving signals to control, for example, the channel 310 of the channel structure 304A, as illustrated in FIG. 3B.

Figure 14:
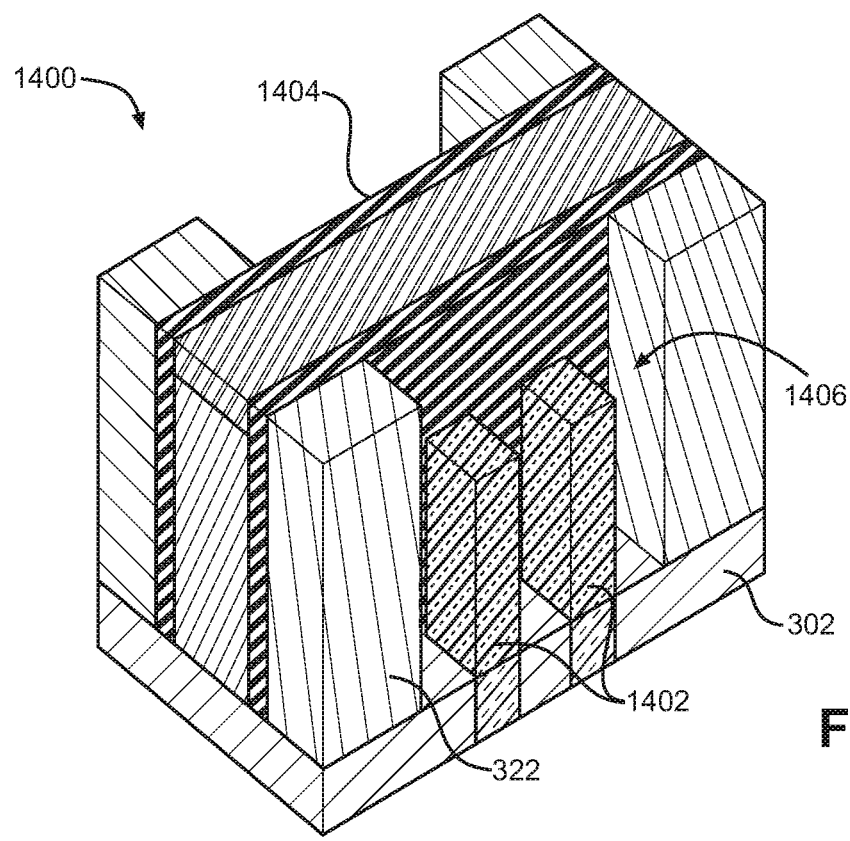
FIG. 14 is a profile diagram of an exemplary fabrication process of etching a portion of an interlayer dielectric (ILD) down to a substrate to expose a source/drain region for fabricating the exemplary CMOS device illustrated in FIGS. 3A and 3B.

FIG. 14 is a profile diagram of a stage 1400 illustrating etching a portion of the interlayer dielectric (ILD) 322 down to the substrate 302 to expose a source/drain region 1402 for fabricating the exemplary CMOS device 300. This etching creates a stressed contact fill metal recess 1404 and a stressed contact fill metal recess 1406 for disposing a source/drain stressed contact fill metal 314 in a later step.

Figure 15:
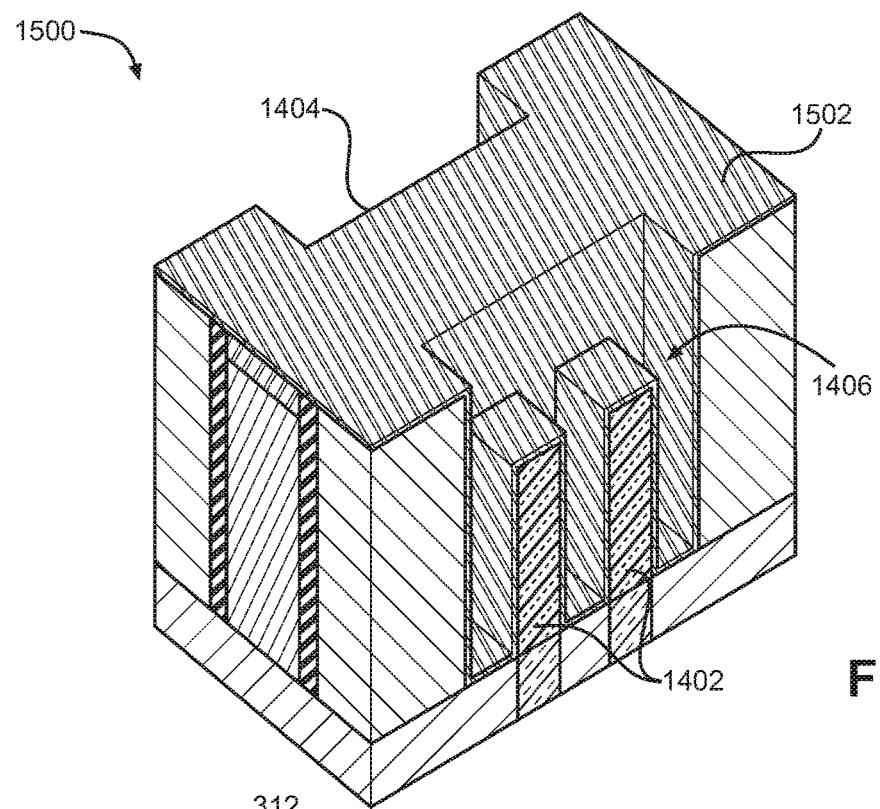
FIG. 15 is a profile diagram of an exemplary fabrication process of disposing a contact layer to form a direct contact to a source/drain region for fabricating the exemplary CMOS device illustrated in FIGS. 3A and 3B.

FIG. 15 is a profile diagram of a stage 1500 illustrating disposing a direct contact layer 1502 to form a direct contact to the source/drain region 1402 for fabricating the exemplary CMOS device 300. In particular, the direct contact layer 1502 is disposed on the stressed contact fill metal recesses 1404, 1406 for providing an interface between the source/drain region 1402 and the source/drain stressed contact fill metal 314 disposed in a later step.

Figure 16:
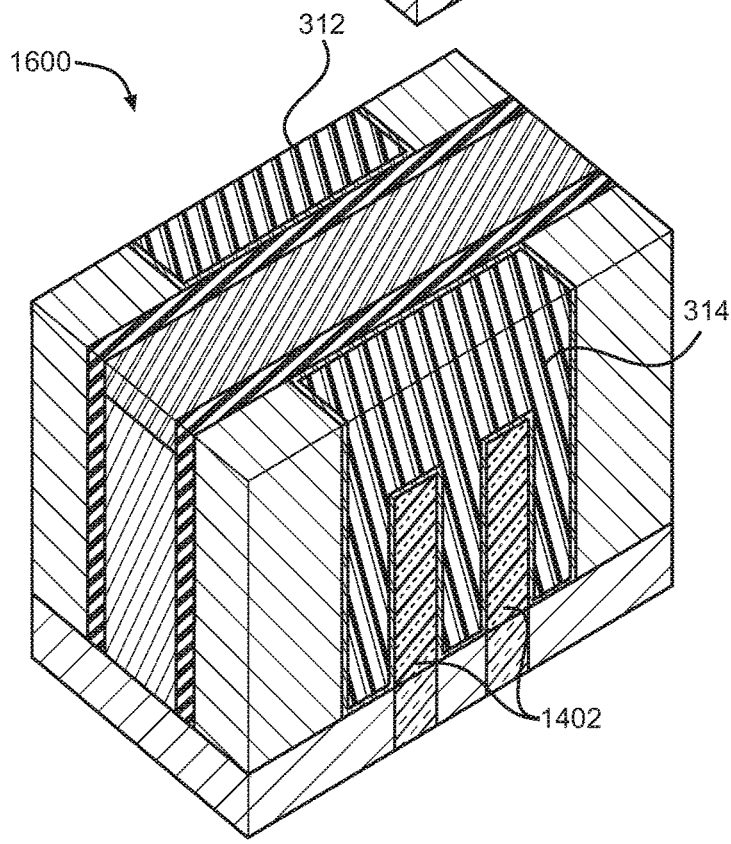
FIG. 16 is a profile diagram of an exemplary fabrication process of disposing and polishing, by chemical mechanical planarization, a source/drain stressed contact fill metal above source/drain regions for fabricating the exemplary CMOS device illustrated in FIGS. 3A and 3B.

FIG. 16 is a profile diagram of a stage 1600 illustrating disposing and polishing by chemical mechanical planarization the source/drain stressed contact fill metals 312, 314 above the source/drain region 1402 for fabricating the exemplary CMOS device 300.

The CMOS devices employing plasma-doped source/drain structures according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 17:
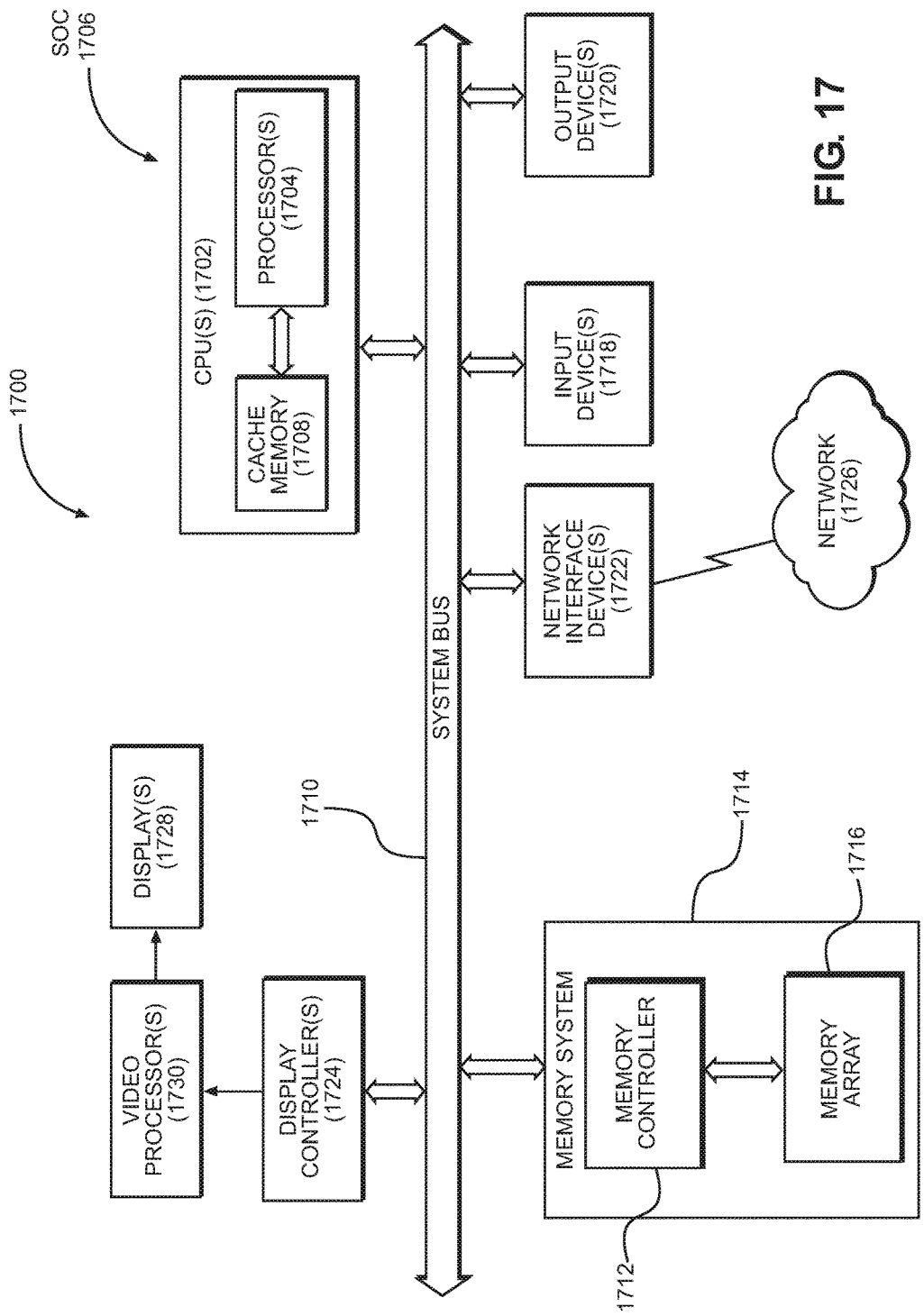
FIG. 17 is a block diagram of an exemplary processor-based system that can include the exemplary CMOS device illustrated in FIGS. 3A and 3B.

In this regard, FIG. 17 is a block diagram of an exemplary processor-based system 1700 that can include the CMOS device 300 illustrated in FIG. 3. In this example, the processor-based system 1700 includes one or more CPUs 1702, each including one or more processors 1704. The processor-based system 1700 may be provided as a system-on-a-chip (SoC) 1706. The CPU(s) 1702 may have cache memory 1708 coupled to the processor(s) 1704 for rapid access to temporarily stored data. The CPU(s) 1702 is coupled to a system bus 1710 and can intercouple master and slave devices included in the processor-based system 1700. As is well known, the CPU(s) 1702 communicates with these other devices by exchanging address, control, and data information over the system bus 1710. For example, the CPU(s) 1702 can communicate bus transaction requests to a memory controller 1712 in a memory system 1714 as an example of a slave device. Although not illustrated in FIG. 17, multiple system buses 1710 could be provided, wherein each system bus 1710 constitutes a different fabric. In this example, the memory controller 1712 is configured to provide memory access requests to a memory array 1716 in the memory system 1714.

Other devices can be connected to the system bus 1710. As illustrated in FIG. 17, these devices can include the memory system 1714, one or more input devices 1718, one or more output devices 1720, one or more network interface devices 1722, and one or more display controllers 1724, as examples. The input device(s) 1718 can include any type of input device, including but not limited to input keys, switches, voice processors, etc. The output device(s) 1720 can include any type of output device, including but not limited to audio, video, other visual indicators, etc. The network interface device(s) 1722 can be any devices configured to allow exchange of data to and from a network 1726. The network 1726 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1722 can be configured to support any type of communications protocol desired.

The CPU(s) 1702 may also be configured to access the display controller(s) 1724 over the system bus 1710 to control information sent to one or more displays 1728. The display controller(s) 1724 sends information to the display(s) 1728 to be displayed via one or more video processors 1730, which process the information to be displayed into a format suitable for the display(s) 1728. The display(s) 1728 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A complementary metal oxide semiconductor (CMOS) device, comprising:
   a substrate;
   a semiconductor material structure disposed above the substrate, the semiconductor material structure comprising one or more channel structures, each channel structure comprising:
   a semiconductor material having a first end portion and a second end portion;
   a source in the first end portion, the source comprising a first plasma-doped portion comprising a dopant above a solid state solubility of the semiconductor material structure of the semiconductor material at the first end portion;
   a drain in the second end portion of the semiconductor material, the drain comprising a second plasma-doped portion comprising a dopant above the solid state solubility of the semiconductor material structure of the semiconductor material at the second end portion; and a channel disposed between the source and the drain; and a gate material disposed adjacent to the channel.

2. The CMOS device of claim 1, further comprising:

a source stressed contact fill metal disposed above the source to provide strain to the channel; and a drain stressed contact fill metal disposed above the drain to provide strain to the channel.

3. The CMOS device of claim 2, wherein the CMOS device comprises an N-type MOS (NMOS) device, wherein the source stressed contact fill metal and the drain stressed contact fill metal provide tensile stress to the channel.

4. The CMOS device of claim 3, wherein the first plasma-doped portion and the second plasma-doped portion each comprises the semiconductor material doped with a plasma material comprised from the group consisting of Arsenic (As) and Phosphorus (P).

5. The CMOS device of claim 2, wherein the CMOS device comprises a P-type MOS (PMOS) device, wherein the source stressed contact fill metal and the drain stressed contact fill metal provide compressive stress to the channel.

6. The CMOS device of claim 5, wherein the first plasma-doped portion and the second plasma-doped portion each comprises the semiconductor material doped with Boron (B).

7. The CMOS device of claim 2, further comprising a first spacer layer disposed on the substrate between a gate and the source stressed contact fill metal, the first spacer layer comprising one of a Nitride-based low-k gate spacer and an air spacer.

8. The CMOS device of claim 1, wherein the source further comprises the first plasma-doped portion of the semiconductor material down to the substrate.

9. The CMOS device of claim 1, wherein the drain further comprises the second plasma-doped portion of the semiconductor material down to the substrate.

10. The CMOS device of claim 1, wherein the source and the drain of each channel structure are non-epitaxial formed structures.

11. The CMOS device of claim 1 integrated into an integrated circuit (IC).

12. The CMOS device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

13. A method of fabricating a complementary metal oxide semiconductor (CMOS) device, comprising:

providing a semiconductor die for the CMOS device, the CMOS device comprising:

a substrate;

a semiconductor material structure disposed above the substrate, the semiconductor material structure comprising one or more channel structures to form a channel; and a sacrificial gate formed on the substrate above the semiconductor material structure;

plasma doping above a solid state solubility of the semiconductor material structure, and annealing a first end portion of the one or more channel structures to activate the first end portion to form a source; and plasma doping above the solid state solubility of the semiconductor material structure, and annealing a second end portion of the one or more channel structures to activate the second end portion to form a drain.

14. The method of claim 13, further comprising:

disposing a first stressed contact fill metal on the substrate and on the source to provide channel strain to the one or more channel structures; and disposing a second stressed contact fill metal on the substrate and on the drain to provide channel strain to the one or more channel structures.

15. The method of claim 14, further comprising, prior to disposing the first stressed contact fill metal and the second stressed contact fill metal:

disposing a first spacer layer on the substrate, adjacent to a first side of the sacrificial gate; and disposing a second spacer layer on the substrate, adjacent to a second side of the sacrificial gate.

16. The method of claim 15, further comprising disposing an interlayer dielectric above the substrate.

17. The method of claim 16, further comprising chemical mechanical planarizing the interlayer dielectric down to the sacrificial gate.

18. The method of claim 17, further comprising:

etching the sacrificial gate down to the substrate;

disposing a gate on the substrate between the first spacer layer and the second spacer layer;

etching the gate to form a recess area above the gate; and disposing a gate contact on the recess area.

19. The method of claim 18, further comprising etching the interlayer dielectric above the first end portion and above the second end portion down to the substrate to form a first stressed contact fill metal recess and a second stressed contact fill metal recess, respectively, to expose the first end portion and the second end portion.

20. The method of claim 19, further comprising disposing a direct contact layer on the first stressed contact fill metal recess, the second stressed contact fill metal recess, and the substrate, wherein disposing the first stressed contact fill metal and the second stressed contact fill metal is performed on the direct contact layer on the first stressed contact fill metal recess and on the second stressed contact fill metal recess.

21. The method of claim 13, further comprising doping the first end portion and the second end portion of the one or more channel structures with a first dopant.

* * * * *